(12) United States Patent
DeProspo et al.

(10) Patent No.: US 12,191,346 B1
(45) Date of Patent: Jan. 7, 2025

(54) SELECTIVE AREA METAL PROCESS FOR IMPROVED METALLURGICAL BONDING OF ALUMINUM TO COPPER FOR INTEGRATED PASSIVE DEVICES IN A SEMICONDUCTOR DEVICE

(71) Applicant: Saras Micro Devices, Inc., Chandler, AZ (US)

(72) Inventors: Bartlet DeProspo, Atlanta, GA (US); Jose F. Solis Camara, Atlanta, GA (US); Ryan Wong, Atlanta, GA (US)

(73) Assignee: SARAS MICRO DEVICES, INC., Chandler, AZ (US)

( * ) Notice: Subject to any disclaimer, the term of this patent is extended or adjusted under 35 U.S.C. 154(b) by 0 days.

(21) Appl. No.: 18/667,666

(22) Filed: May 17, 2024

(51) Int. Cl.
*H01L 23/64* (2006.01)
*H01L 49/02* (2006.01)

(52) U.S. Cl.
CPC ............ *H01L 28/40* (2013.01); *H01L 23/642* (2013.01)

(58) Field of Classification Search
None
See application file for complete search history.

(56) References Cited

U.S. PATENT DOCUMENTS

| | | | | |
|---|---|---|---|---|
| 2006/0120014 A1* | 6/2006 | Nakamura | ............... | H01G 9/15 29/25.03 |
| 2007/0221404 A1* | 9/2007 | Das | ..................... | H05K 3/4623 29/831 |
| 2019/0080849 A1* | 3/2019 | Fujii | ..................... | H01G 4/236 |
| 2023/0067888 A1* | 3/2023 | Sundaram | ........... | H01G 9/0032 |

FOREIGN PATENT DOCUMENTS

| | | | | |
|---|---|---|---|---|
| JP | 2006147607 A | * | 6/2006 | |
| JP | 2008108841 A | * | 5/2008 | |
| JP | 2009031956 A | * | 2/2009 | |
| WO | WO-2019221046 A1 | * | 11/2019 | ............. H01G 9/012 |
| WO | WO-2021241325 A1 | * | 12/2021 | ............... G11C 5/04 |
| WO | WO-2023021881 A1 | * | 2/2023 | ............. H01G 9/025 |

* cited by examiner

*Primary Examiner* — Michael Lebentritt
(74) *Attorney, Agent, or Firm* — Stetina Brunda Garred & Brucker

(57) ABSTRACT

An integrated passive device has a device core of a first metal material and defined by a first side and a second side. Conducting polymer layers are disposed on each of the first side and the second side, and a pattern of one or more direct recesses to the device core are defined in the conducting polymer layers. Bonding material layers are on at least selected areas of the device core that are generally coextensive with the pattern of one or more direct recesses in the conducting polymer layers. First conductive structures of a second metal material different from the first metal material extend from the first side and the second side of the device core. Each of the conductive structures are bonded to a respective one of the bonding material layers. An insulating dielectric encapsulates at least the device core and the conducting polymer layers.

20 Claims, 10 Drawing Sheets

SELECTIVE AREA METAL PROCESS FOR IMPROVED METALLURGICAL BONDING OF ALUMINUM TO COPPER FOR INTEGRATED PASSIVE DEVICES IN A SEMICONDUCTOR DEVICE

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to electronic components and methods for fabricating the same, and more specifically to selective area metal processes for improved metallurgical bonding of aluminum and copper for integrated passive devices in a semiconductor device.

2. Related Art

Capacitors are an important part of many integrated and embedded circuits and are commonly used as energy storage structures, as primary components in filters and other signal conditioning applications, and as specific components of other types of complex integrated circuits. Capacitors are commonly arranged as a pair of opposing thin electrodes separated by a dielectric, with electrical energy being stored as a consequence of equal and opposite charges on the opposing electrodes. Higher capacitance values may be achieved by a greater surface area of the electrode.

A wide variety of configurations of capacitors as well as packaging modalities are known in the art. In one basic configuration, the electrode and dielectric may be rolled into a tight cylindrical structure to optimize the surface area per unit volume. Another configuration may utilize deep trenches in silicon to benefit from more surface area, or as layers of dielectric and metal stacked and connected to each other. Efforts to maximize capacitance and minimize equivalent series resistance (ESR) or capacitors have led to the development of double-sided capacitors such as those described in co-owned U.S. Pat. App. Pub. No. 2023/0067888 entitled "Planar High-Density Aluminum Capacitors for Stacking and Embedding," the entirety of the disclosure of which is incorporated by reference herein. A double-sided capacitor in accordance with the teachings of the disclosure may define a second electrode, e.g., a cathode, of a conductive polymer, metal, or ceramic that is disposed on both sides of a first electrode, e.g., an anode of aluminum that has been etched or otherwise modified to have a high surface area. An oxide layer may be formed between the first and second electrodes to serve as the dielectric.

As noted, the internal structure of capacitors are typically formed of aluminum material. The external connections of the capacitor, particularly those of integrated passive devices, are typically copper. The bonding between aluminum and copper, however, is poor as a consequence of the brittle intermetallic compounds that form between the materials. Without a complex chemical process or the introduction of organic-based additives to improve adhesion, suitable joints between aluminum capacitor components and copper interfaces are difficult to produce. Conventional implementations simply avoids the use of copper altogether, which results in lower performing devices.

Accordingly, there is a need in the art for an improved metallurgical structure and process in integrated passive devices that can withstand harsher environments and extend device longevity, especially in devices with low resistance requirements. It would also be desirable for such devices to meet industry standard reliability requirements in harsh environments while still utilizing copper as an interconnect material.

BRIEF SUMMARY

Integrated passive devices and methods for manufacturing the same are disclosed. In accordance with various embodiments, bonding between components of the device with different metals such as copper and aluminum may improved by depositing a vapor phase metal bonding material.

In one embodiment of the present disclosure, an integrated passive device may include a device core of a first metal material. The device core may have a first side and an opposed second side. The device may include conducting polymer layers that are disposed on each of the first side and the second side of the device core. A pattern of one or more direct recesses to the device core may be defined in the conducting polymer layers. There may also be bonding material layers on at least selected areas of the device core that are generally coextensive with the pattern of one or more direct recesses in the conducting polymer layers. The device may further include first conductive structures of a second metal material different from the first metal material. The conductive structures may extend from the first side of the device core and the second side of the device core. Each of the conductive structures may be bonded to a respective one of the bonding material layers. Additionally, there may be an insulating dielectric that encapsulates at least the device core and the conducting polymer layers.

In another embodiment of the integrated passive device, there may be conducting metal layers that are disposed on each of the conducting polymer layers, and electrode contacts on each of the conducting metal layers. There may additionally be a first terminal layer that faces a first one of the electrode contacts and a first exposed face of the insulating dielectric, along with a second terminal layer that faces a second one of the electrode contacts and a second exposed face of the insulating dielectric opposite the first exposed face. The integrated passive device may include a second conductive structure of the second material extending from the first terminal layer to the second terminal layer.

The bonding material layers extends across interfaces between the insulating dielectric and the first terminal layer, the second terminal layer, the first conductive structures, and the second conductive structure.

According to another embodiment of the present disclosure, there may be a method for fabricating an integrated passive device with improved metallurgical bonding between dissimilar metal layers. The method may include fixing conducting polymer layers to opposing first and second sides of a device core of a first metal material. There may also be a step of etching a pattern of recesses into the conducting polymer layers to the device core. Furthermore, the method may include applying a vapor phase metal bonding material to at least an exposed surface of the device core. A bonding material layer may thus be formed on the device core. There may be a step of etching away edges of the bonding material layer, and a step of forming electrode contacts onto the conducting polymer layers. The method may include laminating an insulating dielectric around the device core and the conducting polymer layers. One or more vias may be at least partly defined by the insulating dielectric corresponding to the pattern of recesses in the conducting polymer layers. There may also be a step of filling the one or more vias with a second metal material that is different from the first metal material. The method may further include forming a first terminal metal layer and a second terminal metal layer onto the insulating dielectric. The first terminal metal layer and the second terminal metal layer may be connected with the electrode contacts and the one or more vias.

Another embodiment of the present disclosure may be a method for fabricating an integrated passive device with improved metallurgical bonding between dissimilar metal layers. The method may include etching a pattern of recesses into a device laminate structure defined by a device core of a first metal material. First and second conducting polymer layers may be fixed to opposing sides of the device core. First and second metal layers may be fixed to respective first and second conducting polymer layers with a carbon coating in between. At least one of the recesses may extend from the first and second metal layers to the device core. The method may also include forming electrode contacts onto the first and second metal layers. There may also be a step of depositing an insulating dielectric around the device laminate structure with the recesses therein being filled with the insulating dielectric. An encapsulate structure with top and bottom faces may be defined by the insulating dielectric. The method may further include drilling one or more vias in areas corresponding to the recesses. There may also be a step of applying a vapor phase metal bonding material to exposed surfaces of the encapsulate structure and the device core. A contiguous bonding material layer may be formed thereon. The method may include filling the one or more vias with a second metal material different from the second metal material. The method may also include forming a first terminal metal layer and a second terminal metal layer onto the encapsulate structure. The first terminal metal layer and the second terminal metal layer may be connected to the one or more vias.

Still another embodiment of the present disclosure may be a capacitor. The capacitor may include first metal layer of a first conductive material, as well as a bonding material layer on at least selected areas of the first metal layer. The capacitor may further include a conductive structure of a second conductive material that is different from the first conductive material. The conductive structure may be bonded to the first metal layer over the bonding material layer.

The present disclosure will be best understood accompanying by reference to the following detailed description when read in conjunction with the drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of an integrated passive device and methods for fabrication of the same and is not intended to represent the only form in which such embodiments may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
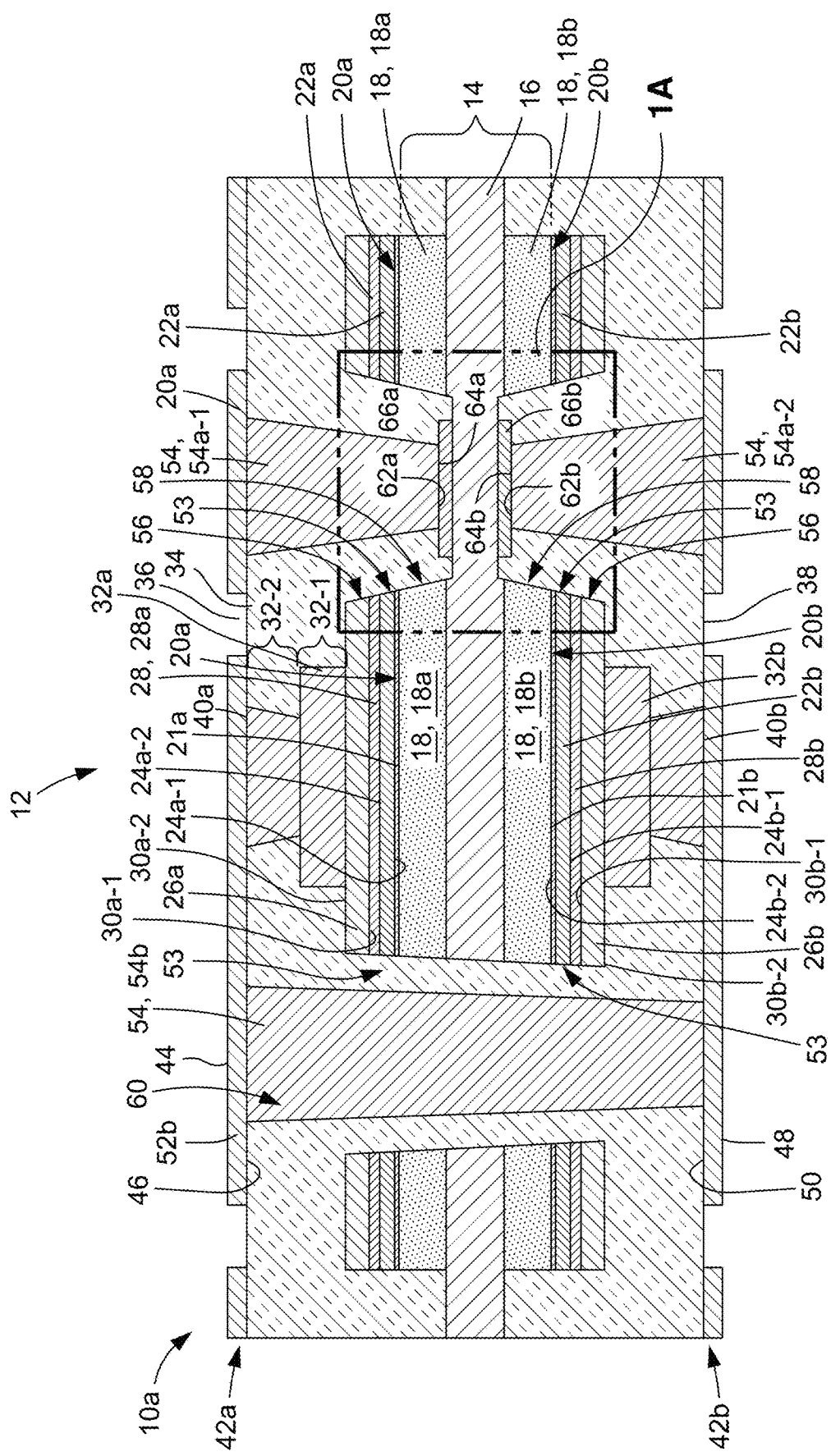
FIG. 1 is a cross-sectional view of a first embodiment of an integrated passive device fabricated with a front-end metallurgical bonding process in accordance with the present disclosure.
Figure 1A:
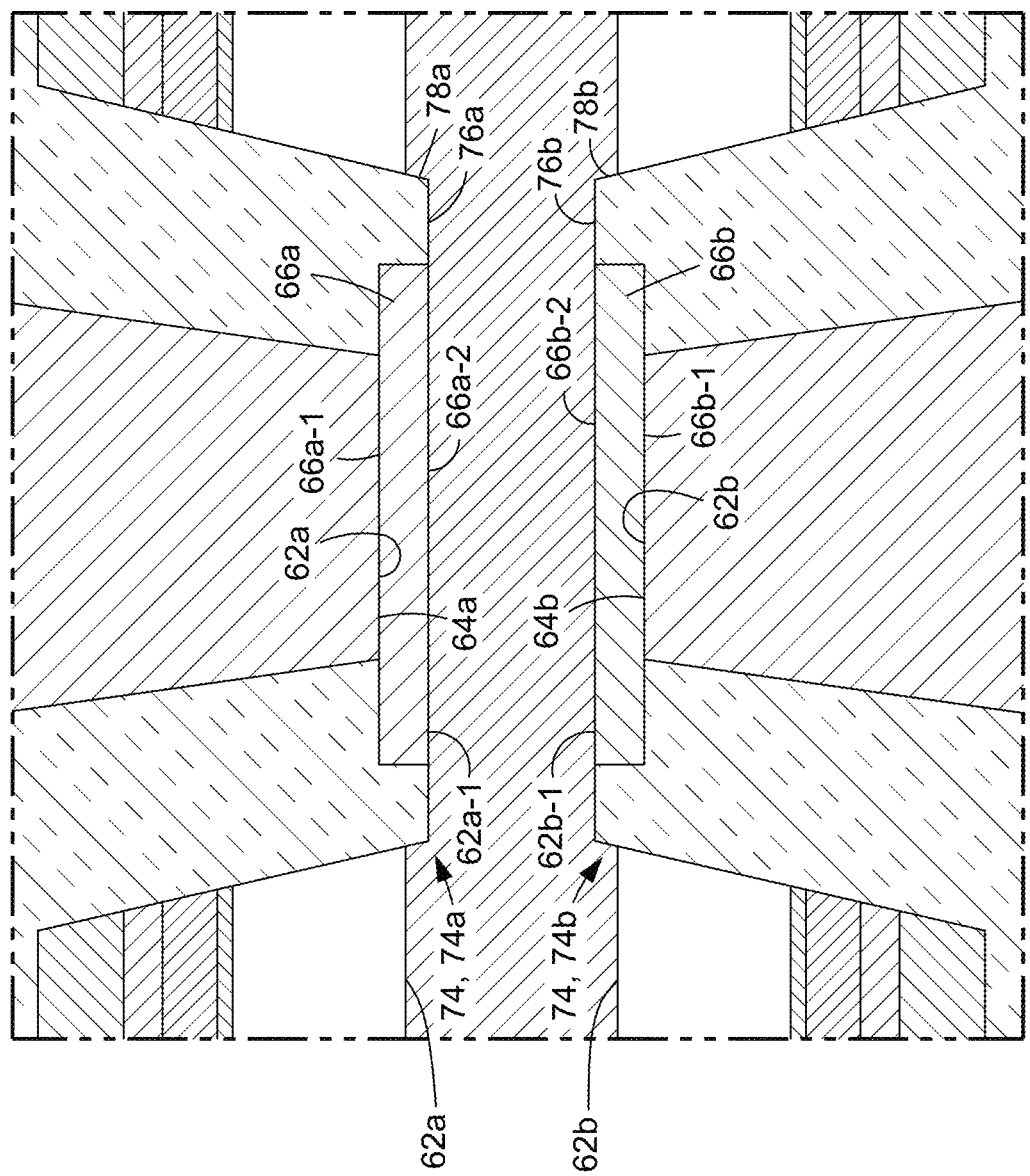
FIG. 1A is a cross-sectional view of the first embodiment of the integrated passive device shown in FIG. 1, with an area 1A therein being shown enlarged.

The embodiments of the present disclosure contemplate the creation of a metallurgical bonding layer between dissimilar metal materials in integrated passive devices, such as between aluminum and copper. It is envisioned that the aerial resistance of the device may be reduced, while improving stability and reliability. FIG. 1 is a cross-sectional view of a first embodiment of an integrated passive device 10a, which may include a capacitor 12. The capacitor 12 includes a device core 14, which may also be referred to as a device core and is understood to be a metal sheet generally defined by a solid area metal center 16, along with high surface area metal peripheries 18 on opposed sides of the solid area metal center 16.

Relative to the orientation of the integrated passive device 10a shown in FIG. 1, there may be a high surface area metal upper periphery 18a that is above the solid area metal center 16, and a high surface area metal lower periphery 18b that is below the solid area metal center 16. The device core 14 may thus be defined by an upper or first side 20a, and a lower or second side 20b opposite the first side 20a. The device core 14, and hence both the solid area metal center 16 and the high surface area metal periphery 18 may be aluminum, tantalum, or any other material suitable for use in capacitor cores. Although the solid area metal center 16 and the high surface area metal periphery 18 may be depicted as separate layers or sheets, it is understood to be a single contiguous structure with a gradual boundary between the two. As a single sheet of aluminum or other metal material, the device core 14 is also defined by two outer surfaces, including a first or upper core outer surface 21a, and an opposed second or lower core outer surface 21b.

The device core 14 may thus be an etched aluminum foil, with the high surface area metal periphery including various tunnels, voids, and/or recessed regions that provide a large surface area with continuous electrical conductivity. Optionally, instead of or in addition to etched foil, the device core 14 may be comprised of sintered aluminum powder supported by and in mechanical and electrical contact with an aluminum foil substrate. Further alternative techniques such as glancing angle deposition or other etching methods may be utilized to build the high surface area metal periphery 18. Embodiments in which there are two high surface area metal peripheries 18a, 18b are depicted, though alternative embodiments in which there is a single high surface area metal periphery 18 are also contemplated.

The capacitor 12 includes conducting polymer layers 22 that are disposed on each of the sides 20 of the device core 14. In further detail, there is a first or upper conducting polymer layer 22a that is adjacent to the first side 20a, and a second or lower conducting polymer layer 22b that is adjacent to the second side 20b. The first conducting polymer layer 22a is defined by an interior face 24a-1 that is a planar abutting relationship with the first core outer surface 21a, and an opposed exterior face 24a-2. The second conducting polymer layer 22b is similarly defined by an interior face 24b-1 that is in a planar abutting relationship with the second core outer surface 21b, and an opposed exterior face 24b-2. In the context of these features, the device core 14, and specifically the middle of the solid area metal center 16, may be considered the center of the laminate assembly, such that interior or inner faces refer to those that are toward such center, while exterior or outer faces refer to those are away from such center.

The conducting polymer layers 22 may be, for example, poly(3,4-ethylenedioxythiophene) polystyrene sulfonate (PDOT: PSS). It will be appreciated by those having ordinary skill in the art that any other suitable conducting polymer material may be substituted, as this particular instance of utilizing PDOT: PSS is by way of example only and not of limitation. Other examples of conducting polymers include polypyrrole, polythiophene, polyaniline, polyacetylene, polyphenylene, poly(p-phenylene-vinylene), and poly(3-hexylthiophene-2,5-diyl (P3HT).

Disposed on each of the conducting polymer layers 22 are conducting metal layers 26, and interposed between these two layers may be carbon coating layers 28. On the upper half of the device structure, a first carbon coating layer 28a exists between the first conducting polymer layer 22a and a first conducting metal layer 26a. In turn, the first conducting metal layer 26a has a planar structure defined by an interior or bottom surface 30a-1, and an opposed exterior or top surface 30a-2. The carbon coating layers 28 may be graphite, a carbon-based ink, a polymeric binder, sputtered carbon, or carbon-polymer composites, and have any suitable thickness.

The interior surface 30a-1 abuts against the first carbon coating layer 28a and faces the exterior face 24a-2 of the first conducting polymer layer 22a. This same structure also exists on the lower half, with a second carbon coating layer 28b between a second conducting metal layer 26b and the second conducting polymer layer 22b. The second conducting metal layer 26b likewise has a planar structure defined by an interior or top surface 30b-1, and an opposed exterior or bottom surface 30b-2. The interior surface 30b-1 abuts against the second carbon coating layer 28b and faces the exterior face 24b-2 of the second conducting polymer layer 22b. The conducting metal layers 26 may be copper foil, electroplated copper, or any other conductive material that may be formed to a planar structure as shown in the figures.

The capacitor 12 may also include landing pads 32 that are positioned onto the conducting metal layers 26. Again, the upper half of the device structure includes an upper or first landing pad 32a, while the lower half includes a lower or second landing pad 32b. The landing pads 32 are contemplated to be fabricated from copper paste or other like material and is different from the conductive material of the conducting metal layers 26. Although the present disclosure makes reference to the landing pads 32 and the formation thereof, it is to be understood that any other step to form an electrode contact, such as electrolytic plating and the like may be substituted without departing from the scope of the present disclosure. In this regard, the embodiments of the disclosure are intended to encompass any electrode contact, so any specific reference to the landing pads 32 refers to any such alternative structure. An electrical connection is understood to be made between the landing pads 32 and the conducting metal layers 26, with the paste material adhering to the exterior surfaces 30a-2, 30b-2 of the first and second conducting metal layers 26a, 26b, respectively. FIG. 1 depicts the landing pads 32 being generally defined by a rectangular portion 32-1 and a trapezoidal portion 32-2, though this is by way of example only and not of limitation.

The foregoing laminate structure may be encapsulated within an insulating dielectric 34, with the encapsulate structure being defined by a top surface 36 and a bottom surface 38. By way of example only and not of limitation, the insulating dielectric 34 may be an electrically insulating polymer material which may optionally be Ajinomoto® Buildup Film (ABF), benzocyclobutene (BCB), and so forth. An exterior surface 40a of the upper or first landing pad 32a may be substantially coplanar with the top surface 36 of the encapsulate structure, and an exterior surface 40b of the lower or second landing pad 32b may be substantially coplanar with the bottom surface 38.

Disposed on the outer extremities of the laminate structure are terminal metal layers 42. In particular, a first terminal metal layer 42a faces the first landing pad 32a as well as the encapsulate structure. The first terminal metal layer 42a has an exposed top surface 44 and an opposed interior bottom surface 46 that abuts against the exterior surface 40a of the first landing pad 32a and the top surface 36 of the encapsulate structure. The second terminal metal layer 42b faces the second landing pad 32b and the encapsulate structure and is defined by an exposed bottom surface 48 and an opposed interior top surface 50 that abuts against the exterior surface 40b of the second landing pad 32b and the bottom surface 38 of the encapsulate structure. The terminal metal layers 42 are understood to be planar metallic structures, preferably copper foil or electroplated copper, and various patterns may be etched to separate one terminal 52 from another, e.g., a first terminal 52a and a second terminal 52b.

In accordance with various embodiments of the present disclosure, at least the conducting polymer layers 22 define a pattern of one or more direct recesses 53 to the device core 14. Such direct recesses 53 are understood to be a part of larger openings for vias 54, which may also be referred to as conductive structures. FIG. 1 illustrates two types of vias, including a pair of top and bottom blind vias 54a-1 and 54a-2, and a through via 54b. The top blind via 54a-1 extends from the top surface 36 to the device core 14, and specifically to the solid area metal center 16. The bottom blind via 54a-2 extends from the bottom surface 38 to the device core 14. The through via 54b extends the entire thickness of the encapsulate structure, from the top surface 36 to the bottom surface 38. As the vias 54 are formed in the laminate structure, it follows that the conducting metal layers 26 and the carbon coating layers 28 likewise define recesses 56 that define a portion of the vias 54, and are substantially overlapping with the direct recesses 53 defined by the conducting polymer layers 22.

The blind vias 54a are understood to reach the solid area metal center 16, so the device core 14 and the high surface area metal periphery 18 likewise define recesses 58 that substantially overlap with the direct recesses 53 and the recesses 56 in the conducting metal layers 26/carbon coating layers 28. As the laminate structure comprised of the device core 14, the conducting polymer layers 22, the conducting metal layers 26/carbon coating layers 28 are encapsulated in the insulating dielectric 34, so the recesses 53, 56, 58 are partly filled with the same. The insulating dielectric 34 may therefore define recesses 60 that are filled by the vias 54. The recess 58 extends partially into the solid area metal center 16, and defines an inset portion 74. In relation to the top blind via 54a-1, there is an inset portion 74a that extends downward into the solid area metal center 16, while in relation to the bottom blind via 54b-1, there is an inset portion 74b that extends upward to the solid area metal center 16.

The vias 54 are formed of a conductive material such as the aforementioned copper paste, though any other suitable conductive material form such as electrolytic copper, or other conductive material such as silver may be substituted without departing from the scope of the present disclosure. The conductive material, e.g., copper, silver, etc., may be more generally referred to as a second material, which is different from the first material utilized in the device core 14, e.g., aluminum.

The blind vias 54a are connected to and establish an electrical connection with the solid area metal center 16 of the device core 14, as illustrated. The solid area metal center 16 thus has a first or top surface 62a, and a second or bottom surface 62b. In the regions corresponding to the inset portion 74, however, there is defined a top inset surface 62a-1 and a bottom inset surface 62b-1.

The blind vias 54a are understood to be formed of a copper paste material, while the device core 14 is aluminum. In order to improve the metallurgical bonding between these two structures, there may be a bonding material layer 66 that is generally coextensive with the patterns of the recesses 53, 56, 58 (or more generally the recess 60). Thus, there may be a first bonding material layer 66a between the solid area metal center 16 and the top blind via 54a-1, and a second bonding material layer 66b between the solid area metal center 16 and the bottom blind via 54a-2. In further detail, the first bonding material layer 66a has a first or via-side surface 66a-1 and a second or core-side surface 66a-2, and the second bonding material layer 66b has a first or via-side surface 66b-1 and a second or core-side surface 66b-2. The via-side surface 66a-1 of the first bonding material layer 66a faces a bottommost face of the top blind via 54a-1, referred to as a first via core-side surface 62a. The via-side surface 66b-1 of the second bonding material layer 66b faces an uppermost face of the bottom blind via 54b-1, referred to as a second via core-side surface 62b. Each of the via-side surfaces 66a-1 and 66b-1 of the first and second bonding material layers 66a, 66b, respectively, extend beyond the limits of the top and bottom blind vias 54a-1, 54b-1, respectively. The first core-side surface 66a-2 is generally coplanar with the top inset surface 62a-1 and the second core-side surface 66b-2 is generally coplanar with the bottom inset surface 62b-1.

The bonding material layers 66 are not understood to extend the entire width of the inset portion 74. Accordingly, while some segments of the core-side surface 66a-2, 66b-2 are coextensive with the top inset surface 62a-1 and bottom inset surface 62b-1, respectively, the insulating dielectric 34 further defines a shoulder surface 76a that faces the core 16 and is coplanar with the top inset surface 62a-1, and a shoulder surface 76b that faces the core 16 and is coplanar with the bottom inset surface 62b-1. There may also be an angled connecting surface 78a between the shoulder surface 76a and the top surface 62a, and another angled connecting surface 78b between the shoulder surface 76b and the bottom surface 62b.

As will be described in further detail below, the bonding material layer 66 may be a vapor phase metal that is deposited on to the top and bottom surfaces 62a, 62b. The bonding material layer 66 may thus spatially extend beyond the surface area of the interface surfaces of the blind vias 54a, and may be partially encapsulated by the insulating dielectric 34. As a result of the bonding material layer 66, a more stable and reliable interface between the copper structure and the aluminum structure, i.e., of dissimilar metals, is understood to be possible.

Figure 2:
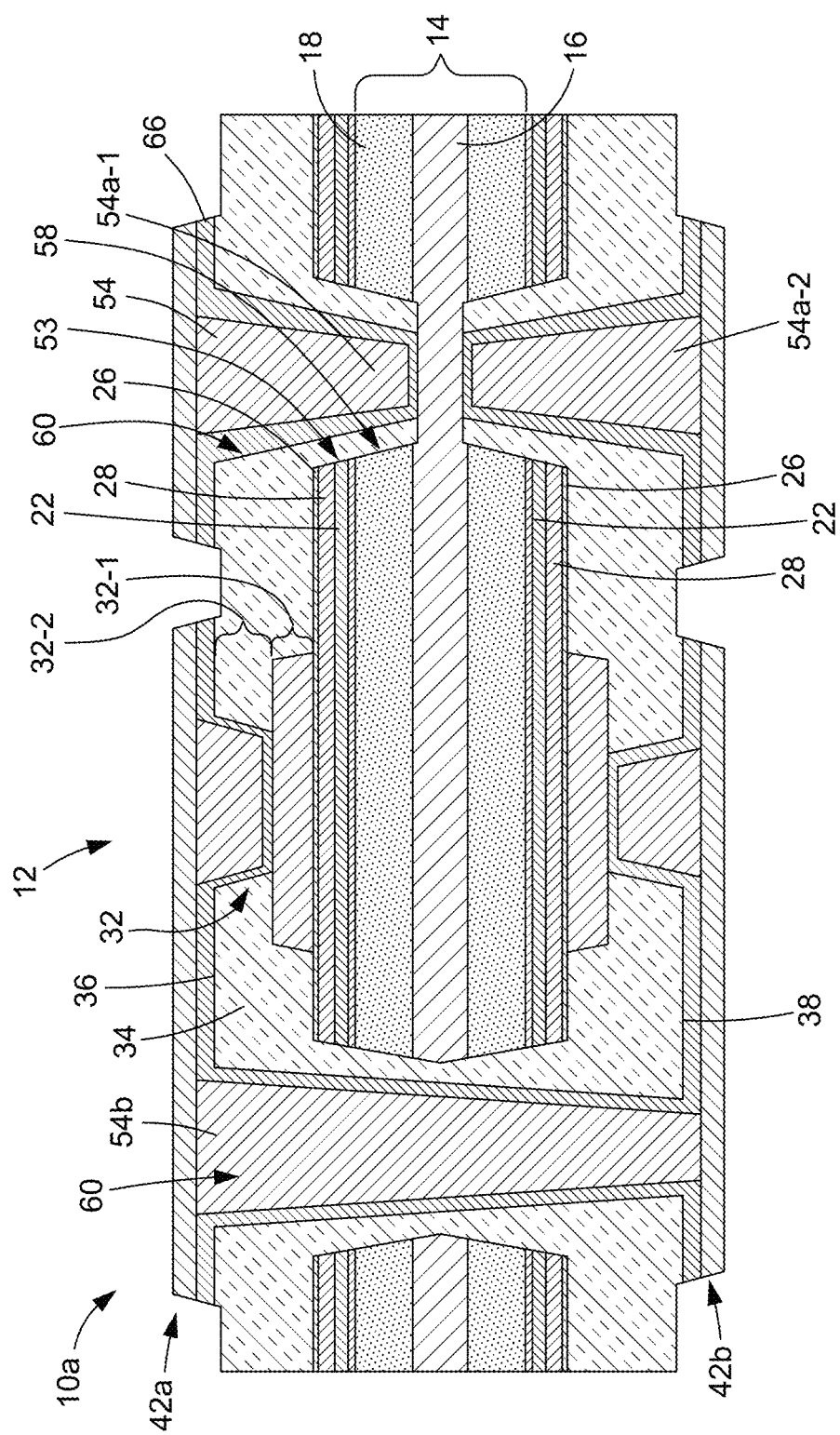
FIG. 2 is a cross-sectional view of a second embodiment of the integrated passive device fabricated with a back-end metallurgical bonding process.

FIG. 2 shows a cross-sectional view of a second embodiment of the integrated passive device 10b, including the capacitor 12 that is substantially the same as in the first embodiment 10a, described above. Accordingly, the integrated passive device 10b includes the device core 14 generally defined by the solid area metal center 16 and high surface area metal peripheries 18. As in the first embodiment, the capacitor 12 includes the conducting polymer layers 22 that are disposed on each side of the device core 14. Furthermore, disposed on each of the conducting polymer layers 22 are the conducting metal layers 26, and interposed between these two layers may be the carbon coating layers 28. The landing pads 32 are positioned onto the conducting metal layers 26, though in the second embodiment 10b, the rectangular portion 32-1 may be structurally separated from the trapezoidal portion 32-2. The description of the first embodiment of the integrated passive device 10a included additional details regarding various surfaces of the foregoing components of the laminate structure but will not be repeated in connection with the second embodiment 10b for the sake of brevity, unless otherwise pertinent to the features thereof differing from the first embodiment 10a. However, it is to be understood that the second embodiment 10b has the same surfaces and relationships between such surfaces as in the first embodiment 10a.

The foregoing laminate structure, excluding the trapezoidal portion 32-2 of the landing pads 32, may be encapsulated within the insulating dielectric 34. The resultant encapsulate structure may be defined by the top surface 36 and the bottom surface 38.

On the outer extremities of the laminate structure, the second embodiment 10b incorporates the same terminal metal layers 42, including the first terminal metal layer 42a and the second terminal metal layer 42b. The terminal metal layers 42 abut against the landing pads 32, as well as the encapsulate structure.

In the second embodiment of the integrated passive device 10b, the conducting polymer layers 22 also define the pattern of one or more direct recesses 53 to the device core 14, and are parts of larger openings for the vias 54. There are again two types of vias, including the pair of top and bottom blind vias 54a-1 and 54a-2, and the through via 54b. The top blind via 54a-1 extends from the top surface 36 to the device core 14, and specifically to the solid area metal center 16. The bottom blind via 54a-2 extends from the bottom surface 38 to the device core 14. The through via 54b extends the entire thickness of the encapsulate structure, from the top surface 36 to the bottom surface 38. The carbon coating layers 28 likewise define recesses 56 that are a part of the vias 54, and are substantially overlapping with the direct recesses 53 defined by the conducting polymer layers 22. The device core 14 and the high surface area metal periphery 18 likewise define recesses 58 that substantially overlap with the direct recesses 53 and the recesses 56 in the conducting metal layers 26/carbon coating layers 28. With the laminate structure of the device core 14, the conducting polymer layers 22, the conducting metal layers 26/carbon coating layers 28 being encapsulated in the insulating dielectric 34, the recesses 53, 56, and 58 are partly filled. The insulating dielectric 34 thus defines the recesses 60 filled by the vias 54.

Whereas the first embodiment 10a incorporated a bonding material layer at only the interface between the copper via 54 and the aluminum device core 14, the second embodiment 10b contemplates the bonding material layer 66 extending across the interfaces between the insulating dielectric 34 and the vias 54. As the rectangular portion 32-1 is separate from the trapezoidal portion 32-2, the bonding material layer 66 extends between these two sections of the landing pad 32. Along these lines, the bonding material layer 66 extends across the surfaces defining the recesses 60, as well as the terminal metal layers 42. The different structures of the bonding material layer 66 in the first embodiment 10a and the second embodiment 10b are understood to be the result of different fabrication methods, as will be described more fully below. The first embodiment 10a is fabricated with a "front end" process in which the bonding material layer 66 is deposited after the recesses 60 for the vias 54 are patterned, before encapsulating the laminate structure with the insulating dielectric 34. The second embodiment 10b is fabricated with a "back end" process where the laminate structure is assembled and encapsulated, and then the bonding material layer 66 is deposited.

Figure 3:
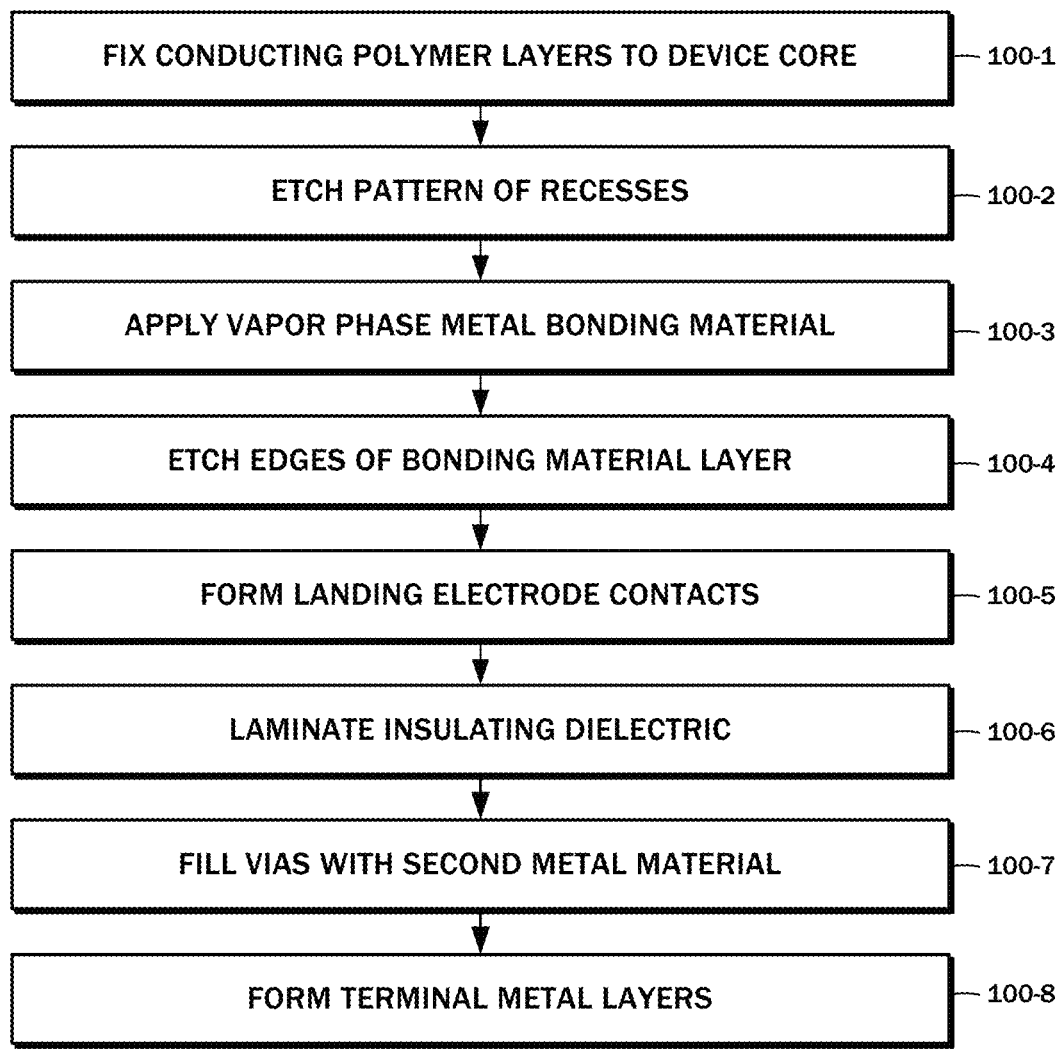
FIG. 3 is a flowchart depicting the steps of a first embodiment of a method for fabricating an integrated passive device with improved metallurgical bonding between dissimilar metal layers in accordance with the present disclosure.
Figure 4A:
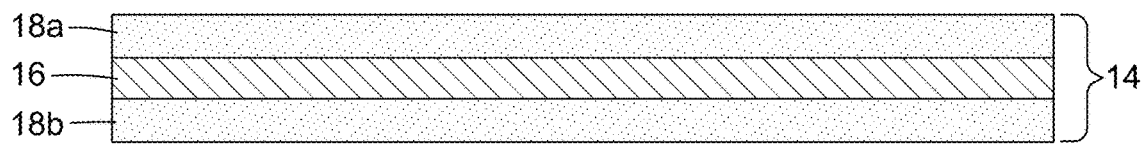
FIG. 4A-4H are cross-sectional views of the first embodiment of the integrated passive device at various states of fabrication according to the first embodiment of the method.
Figure 4B:
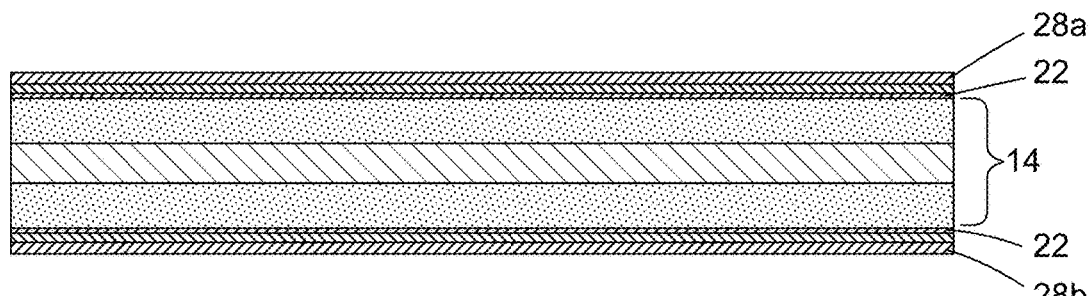

With reference to the flowchart of FIG. 3 as well as the cross-sectional views of the first embodiment of the integrated passive device 10a in various stages of completion in FIGS. 4A-4H, the front-end process begins with a step 100-1 of fixing the conducting polymer layers 22 onto the device core 14. As discussed above, the device core 14 may be a double-sided foil of aluminum, with the solid area metal center 16 and the high surface area metal peripheries 18a, 18b around the solid area metal center 16, and FIG. 4A best illustrates the state of the device core 14 prior to the step 100-1 of fixing the conducting polymer layers 22 onto the device core. FIG. 4B, in turn, illustrates the conducting polymer layers 22 fixed onto the device core 14, along with the carbon coating layers 28 applied to the conducting polymer layers 22.

Figure 4C:
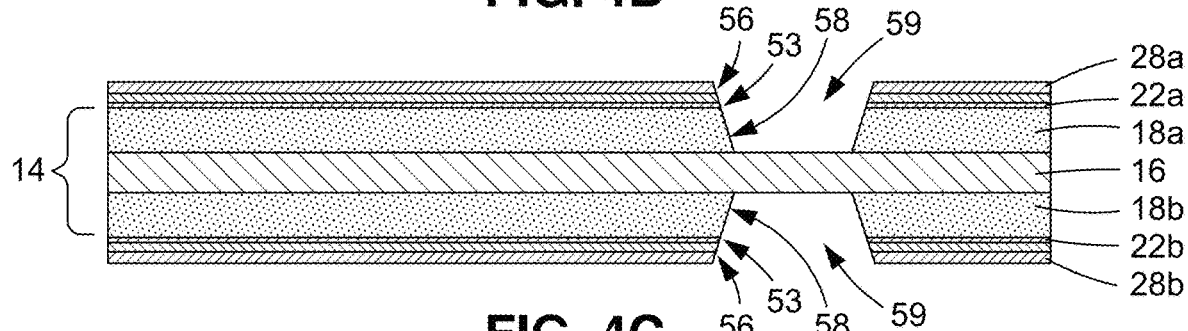

Next, the method continues to a step 100-2 of etching patterns of direct recesses 53 into at least the conducting polymer layers 22 to the device core 14. As shown in FIG. 4C, the direct recesses 53 extend through the high surface area metal peripheries 18, and to the solid area metal center 16. The recesses 58 defined thereby are understood to be substantially coextensive with the direct recesses 53 on the conducting polymer layers 22 and the recesses 56 defined by the carbon coating layers 28. Each of these recesses 53, 56, and 58 may be collectively referred to as a laminate structure recess 59. Generally, the recesses are etched at any location in which the first metal material, e.g., aluminum, is to bond with the second metal material, e.g., copper.

Figure 4D:
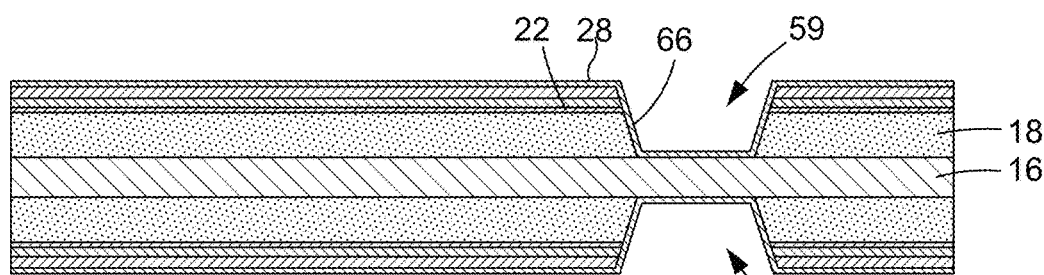

After this etching step, the method continues with a step 100-3 of applying a vapor phase metal bonding material to at least an exposed surface of the device core 14. The outcome of this step is shown in FIG. 4D, where the bonding material layer 66 is disposed on the solid area metal center 16, and the sidewalls of the high surface area metal peripheries 18, the conducting polymer layers 22, and the carbon coating layers 28.

Figure 4E:
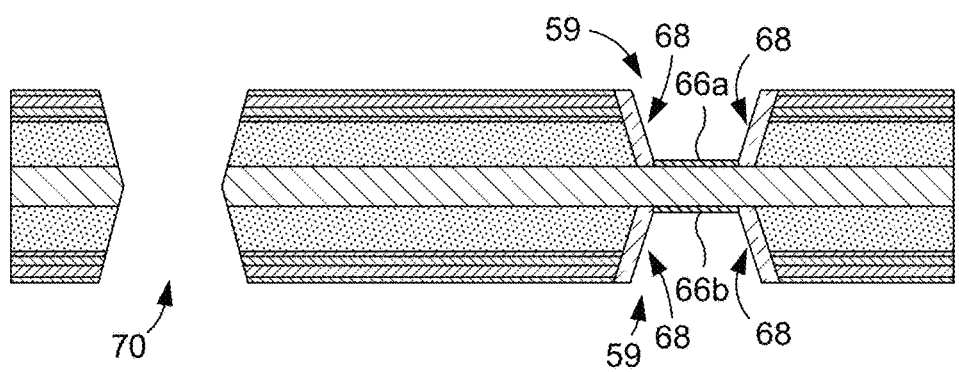

As shown in FIG. 4E, the method proceeds to a step 100-4 of etching edge regions 68 of the laminate structure recesses 59. In accordance with some embodiments of the present disclosure, this etching step may also include defining a through hole or slot 70. The etching may be performed by a suitable laser, and so step 100-4 may also be referred to as a laser patterning step. Any other material removal apparatus may be substituted without departing from the present disclosure.

Figure 4F:
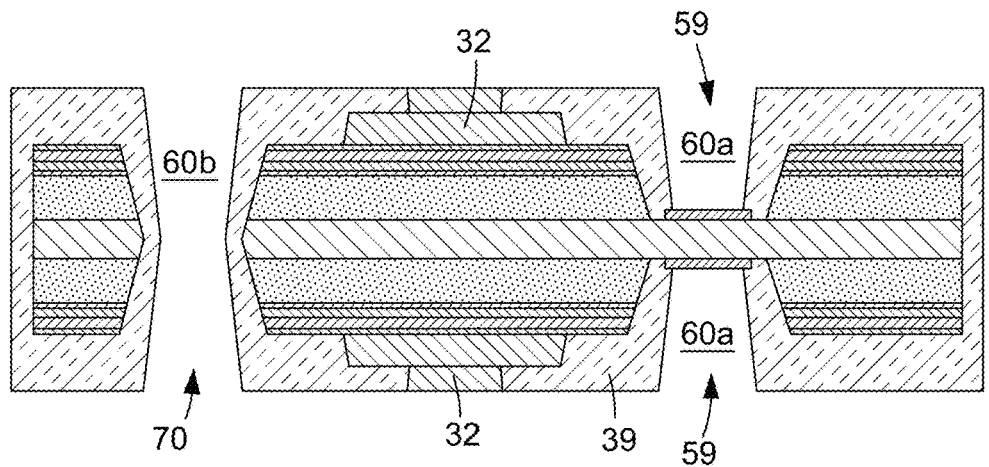

FIG. 4F illustrates the completion of a step 100-5 of forming the landing pads 32 onto the laminate structure or the electrode contacts more generally as referenced above, as well as a step 100-6 of laminating the insulating dielectric 34. This may be achieved through the application of a copper foil, or electrolytic plating, and so on. As shown, the entirety of the laminate structure recess 59 in the case of the blind vias, and the recess 80 in the case of the through hole or slot 70, is not filled. Rather, the recesses 60a for the blind vias and the recess 60b for the through via 54b remain.

Figure 4G:
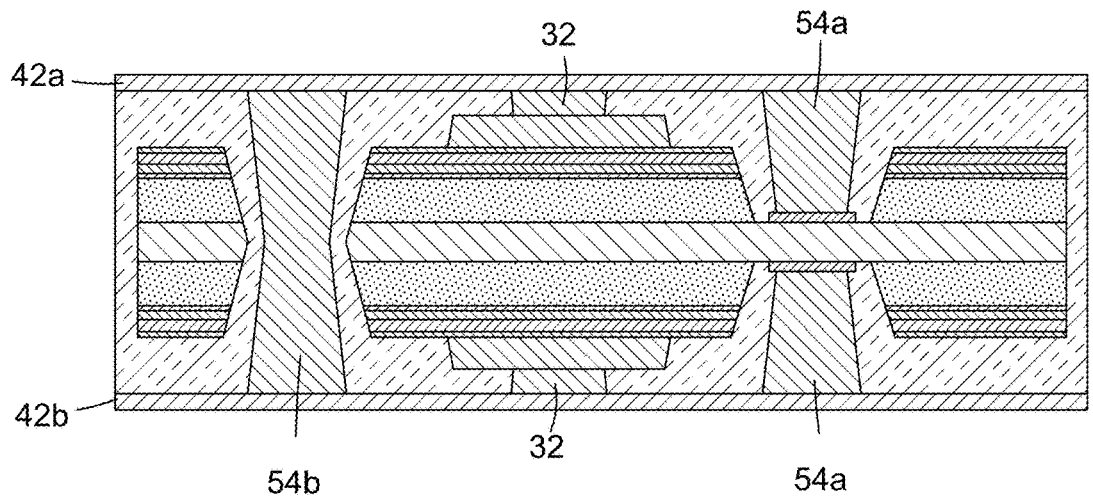

In a step 100-7, the completion of which results in a state as shown in FIG. 4G, the recesses 60a, 60b are filled with the second conductive metal material, e.g., copper paste, to define the blind vias 54a and the through via 54b. The copper paste may be deposited into the recesses 60, and may be sintered, that is, heated without reaching the melting point, with the paste material being compacted and forming the structure of the vias 54. FIG. 4G also illustrates the completion of a step 100-8 of laminating the first terminal metal layer 42a and the second terminal metal layer 42b onto the insulating dielectric 34. As a result, the terminal metal layers 42 may be connected to the landing pads 32 and the vias 54.

Figure 4H:
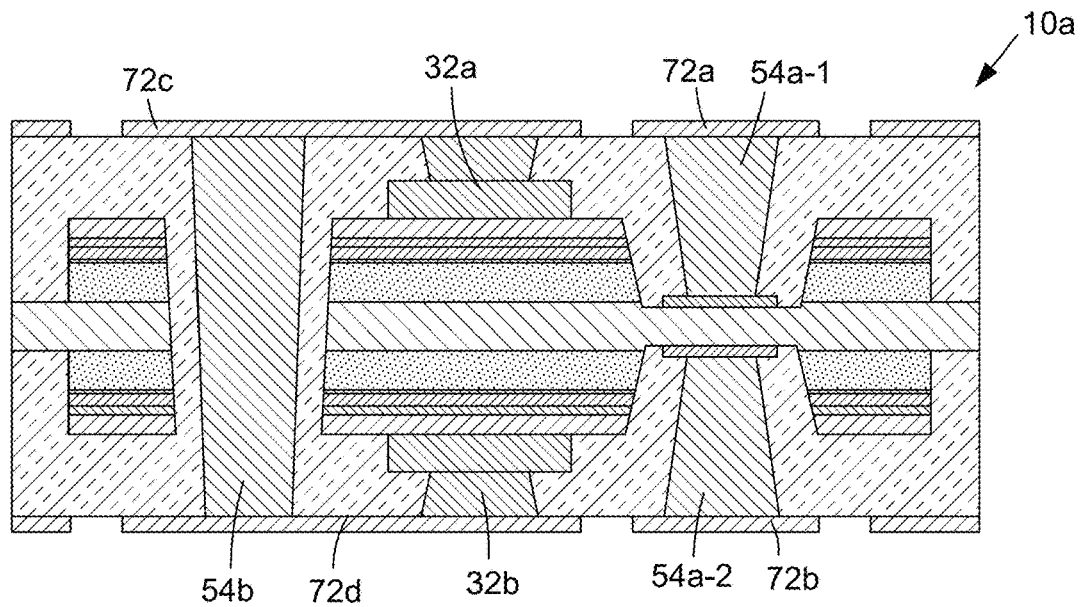

FIG. 4H shows the final form of the first embodiment of the integrated passive device 10a following a terminal metal patterning step. The terminal metal layers 42 may thus be separated into individual terminals 72, including a first terminal 72a that is connected to the top blind via 54a-1, a second terminal 72b is that is connected to the bottom blind via 54a-2, a third terminal 72c connected to the through via 54b and the first landing pad 32a, and a fourth terminal 72d likewise connected to the through via 54b and the second landing pad 32b.

Figure 5:
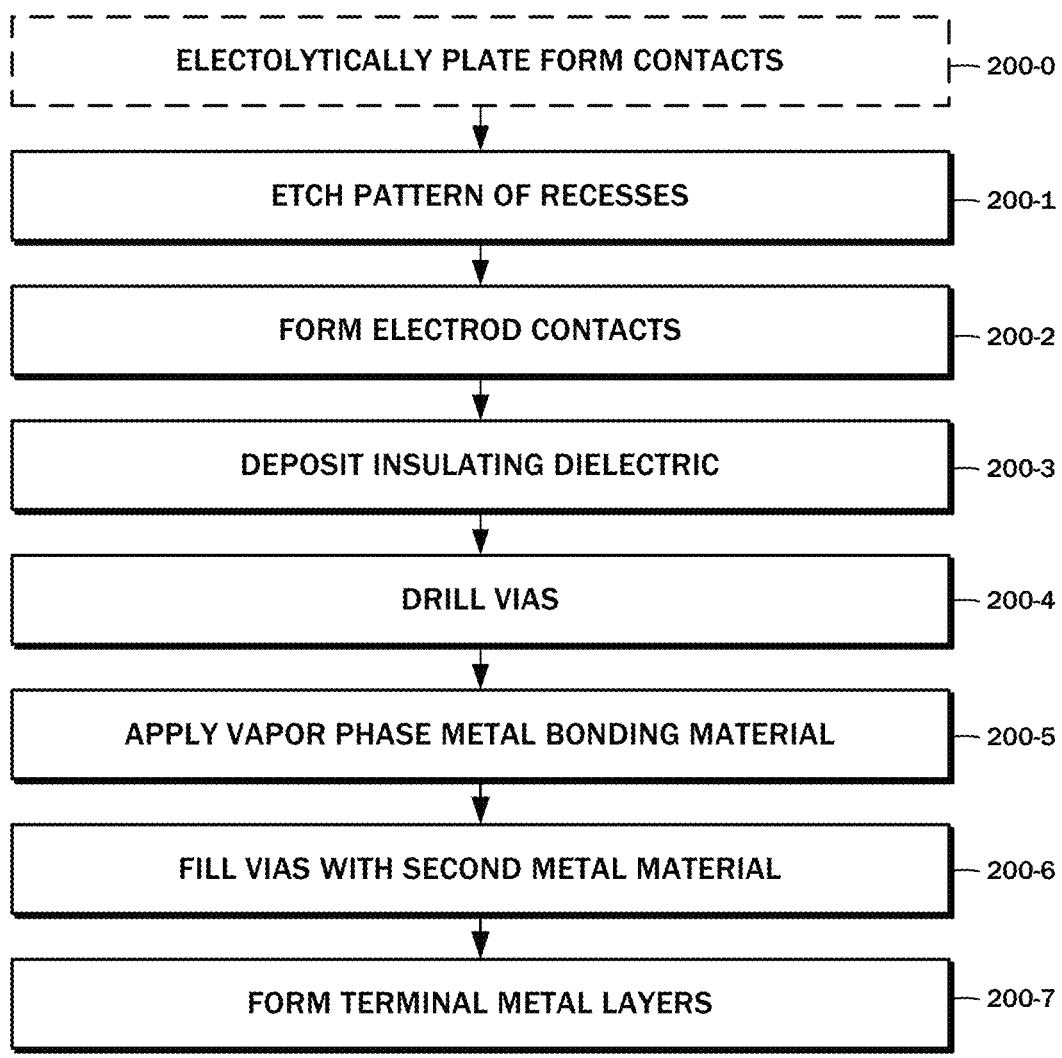
FIG. 5 is a flowchart depicting the steps of a second embodiment of the method for fabricating the integrated passive device in accordance with the present disclosure.
Figure 6A:
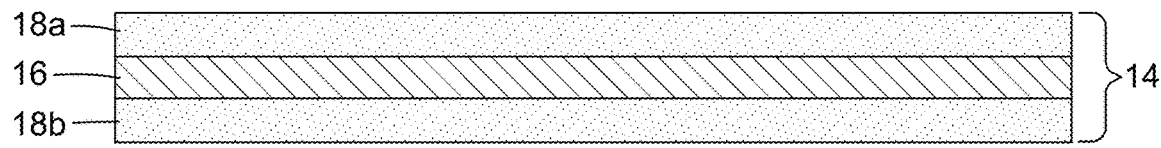
FIGS. 6A-6J are cross-sectional views of the second embodiment of the integrated passive device in various states of fabrication according to the second embodiment of the method.
Figure 6B:
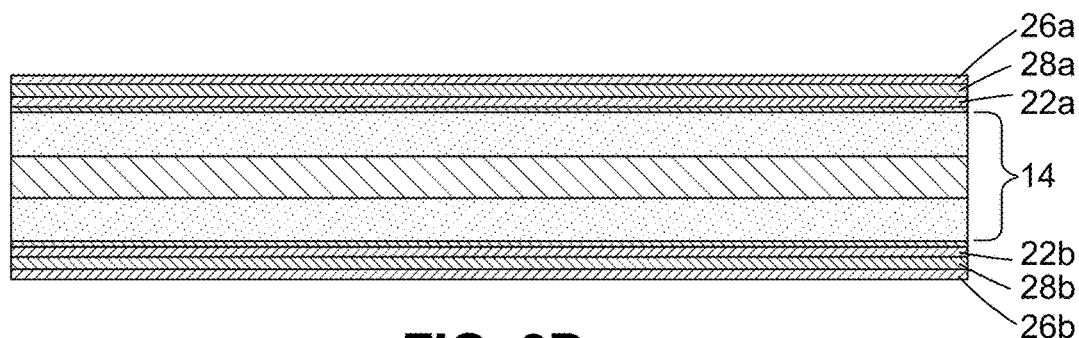
Figure 6C:
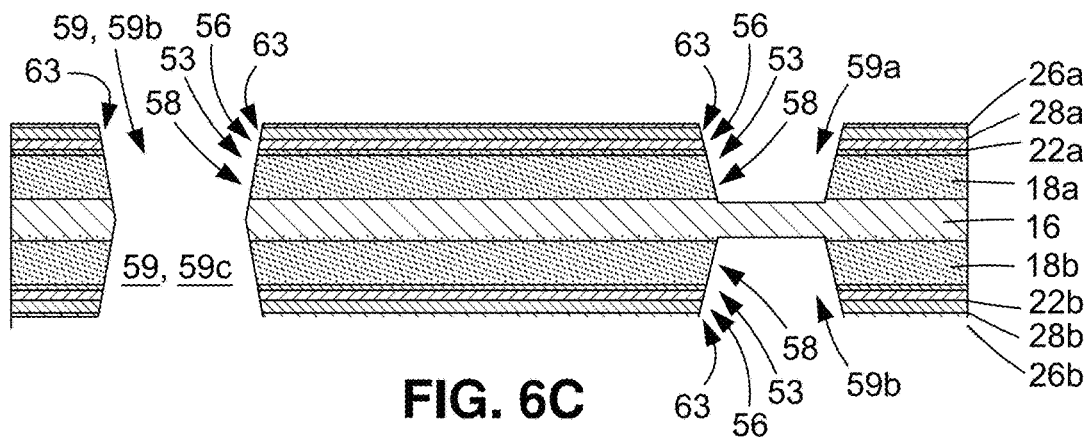

The flowchart of FIG. 5 shows the steps involved in various embodiments of the back-end process for fabricating the second embodiment of the integrated passive device 10b. The cross-sectional views of FIGS. 6A-6J show the device in various stages of completion following these steps. The method includes a step 200-1 of etching patterns of direct recesses 53 into a device laminate structure. As shown in FIG. 6A, the device core 14 may be a double-sided foil of aluminum with the solid area metal center 16 and the high surface area metal peripheries 18a, 18b. FIG. 6B illustrates the laminate structure following a precursor step in which the conducting polymer layers 22 are fixed onto the device core 14, and the carbon coating layers 28 are applied thereto. Layered onto the carbon coating layers 28 are the conducting metal layers 26.

In further detail, this etching step 200-1 according to one embodiment involves the creation of the direct recesses 53 in the conducting polymer layers 22 to the device core 14, and through the high surface area metal peripheries 18 to the solid area metal center 16. In another embodiment, the etching step 200-1 may be preceded by an optional step 200-0 of electrolytically plating to form subsequent contacts. The recesses 58 defined thereby are understood to be substantially coextensive with the direct recesses 53 on the conducting polymer layers 22, the recesses 56 defined by the carbon coating layers 28, and recesses 63 defined by the conducting metal layers 26. Each of these recesses 53, 56, 58, and 63 may be collectively referred to as a laminate structure recess 59. The recesses are etched at any location in which the first metal material, e.g., aluminum, is to bond with the second metal material, e.g., copper. These etching steps may thus be referred to as patterning. The embodiments of the present disclosure contemplate both through vias and blind vias, with a first laminate structure recess 59a and a second laminate structure recess 59b defining the pathway for the blind vias. A third laminate structure recess 59c defines the pathway for the through via. Additional details of the via structures will be described below.

Figure 6D:
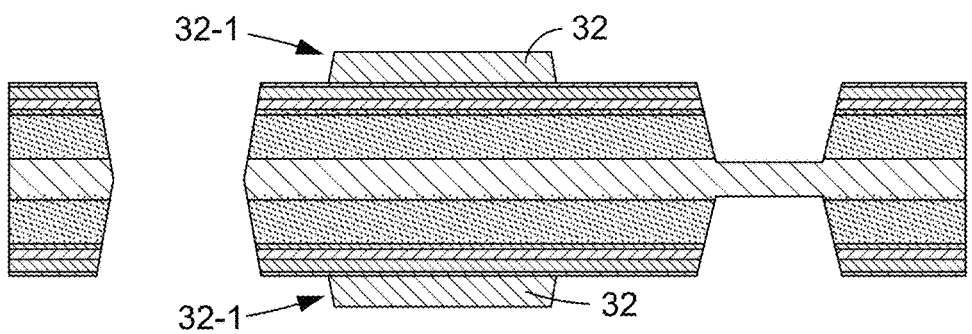
Figure 6E:
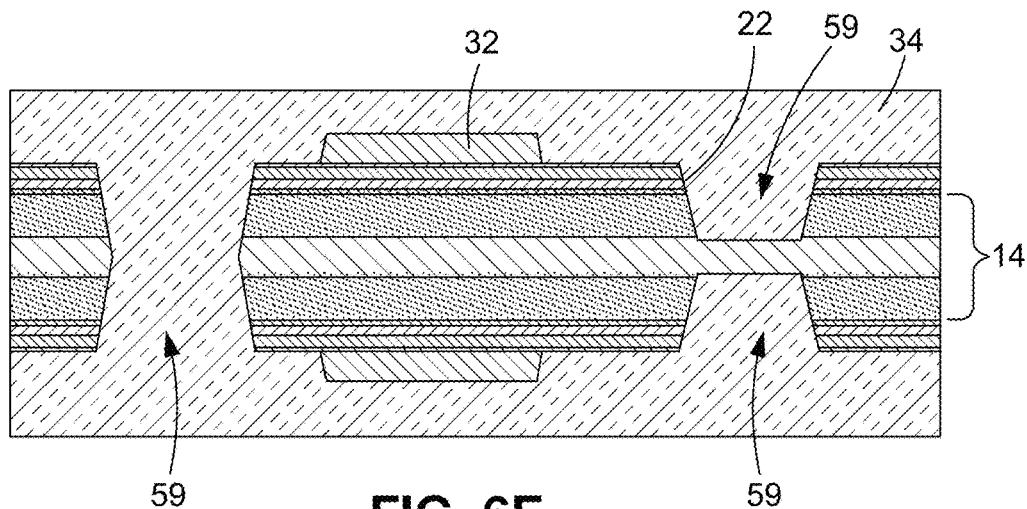

FIG. 6D illustrates the completion of a step 200-2 of forming electrode contacts, and more specifically in the context of this embodiment, depositing the landing pads 32 onto the laminate structure, or at least the rectangular portion 32-1 thereof. Thereafter, in a step 200-3, the method includes depositing the insulating dielectric 34, encapsulating the entirety of the device laminate structure fabricated up to that point, including the device core 14, the conducting polymer layers 22, the carbon coating layers 28, and the landing pads 32. In contrast to the front-end process, the laminate structure recesses 59 are filled with the insulating dielectric 34.

Figure 6F:
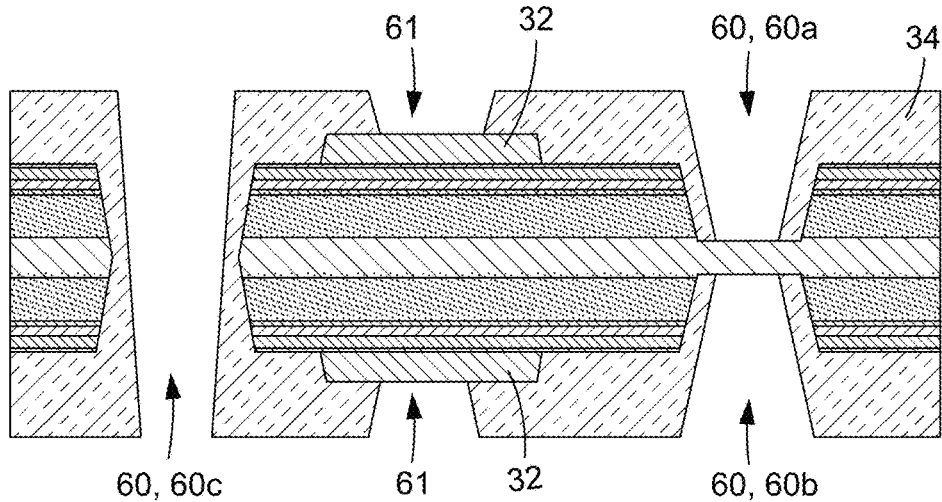

Referring now to FIG. 6F and the flowchart of FIG. 5, the method continues with a step 200-4 of drilling through a portion of the insulating dielectric 34 to define the recesses 60 for the vias 54. Like the laminate structure recesses 59 discussed above, a recess 60a defined in the insulating dielectric 34 corresponding to the first laminate structure recess 59a is for a first blind via, while a recess 60b defined in the insulating dielectric 34 corresponding to the second laminate structure recess 59b is for a second blind via. A recess 60c defined in the insulating dielectric 34 corresponds to the third laminate structure recess 59c for the through via. Additionally, residual dielectric material is removed from regions proximal to the landing pads 32, thus defining landing pad recesses 61 in the insulating dielectric 34.

Figure 6G:
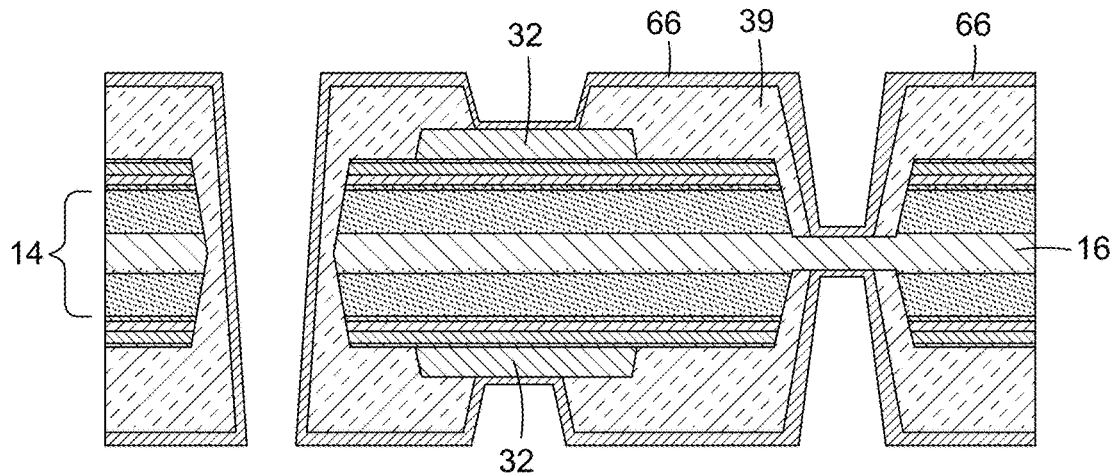

After this step, the method continues with a step 200-5 of applying a vapor phase metal bonding material to at least an exposed surface of the device core 14, though in this embodiment, this vapor deposition takes place around the entirety of the laminate structure fabricated up to this point. The outcome of this step is shown in FIG. 6G, where the bonding material layer 66 is disposed on the outer periphery of the insulating dielectric 34 and those exposed portions of the solid area metal center 16 of the device core 14 and the landing pads 32. The vapor deposition is contemplated to remove the dielectric residues and bonds directly to the first metal material.

Figure 6H:
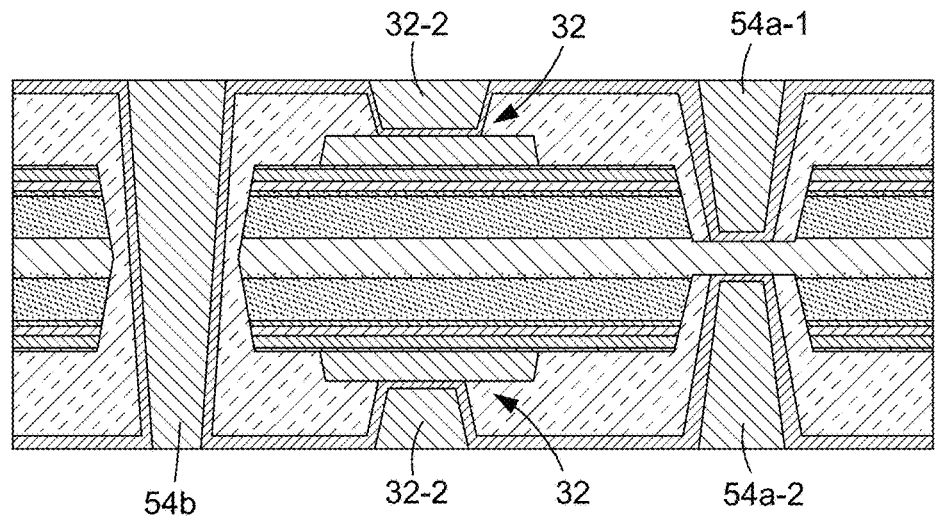

In a step 200-6, the completion of which results in a state as shown in FIG. 6H, the recesses 60a, 60b are filled with the second conductive metal material, e.g., copper paste, to define the blind vias 54a and the through via 54b. Additionally, the landing pad recesses 61 are similarly filled with the second conductive metal material. The copper paste may be deposited into the recesses 60, 61, and may be sintered, that is, heated without reaching the melting point, with the paste material being compacted and forming the structure of the vias 54 and the trapezoidal portion 32-2 of the landing pads 32.

Figure 6I:
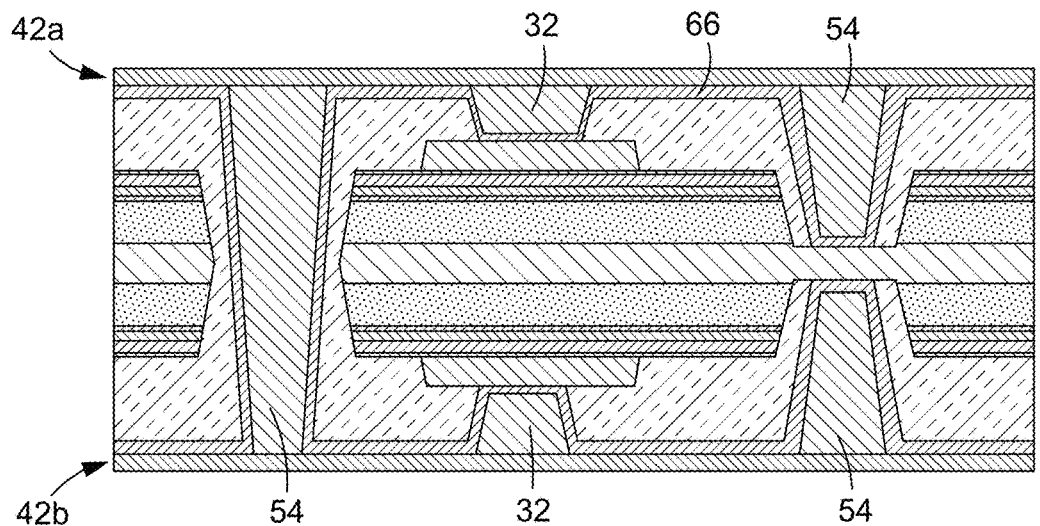

FIG. 6I illustrates the completion of a step 200-7 of forming the first terminal metal layer 42a and the second terminal metal layer 42b onto the bonding material layer 66, the vias 54, and the landing pads 32. This may be achieved with the application of a copper foil, electrolytic plating, and so on. As a result, the terminal metal layers 42 may be connected to the landing pads 32 and the vias 54.

Figure 6J:
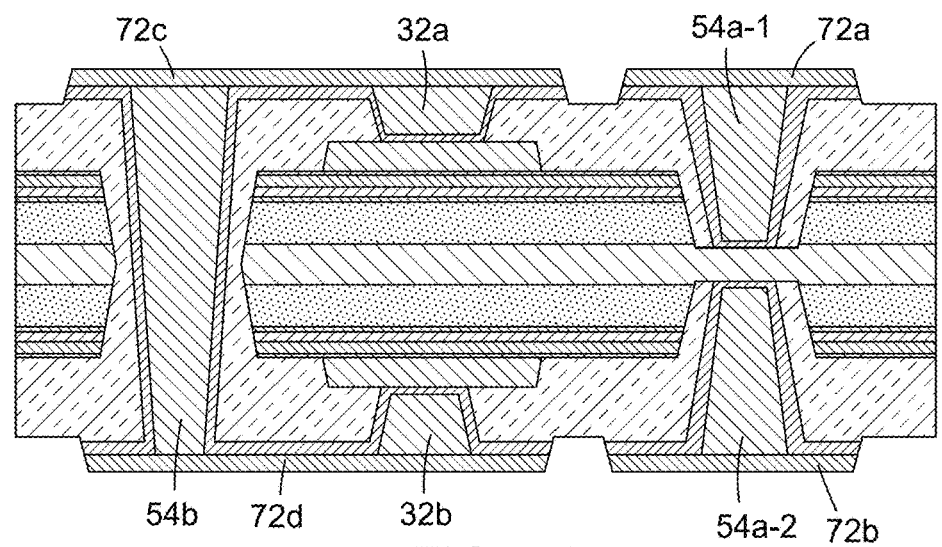

FIG. 6J shows the final form of the second embodiment of the integrated passive device 10b following a terminal metal patterning step. The terminal metal layers 42 may thus be separated into individual terminals 72, including a first terminal 72a that is connected to the top blind via 54a-1, a second terminal 72b is that is connected to the bottom blind via 54a-2, a third terminal 72c connected to the through via 54b and the first landing pad 32a, and a fourth terminal 72d likewise connected to the through via 54b and the second landing pad 32b.

The particulars shown herein are by way of example and for purposes of illustrative discussion of the embodiments of the integrated passive device and methods for fabrication of the same and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A method for fabricating an integrated passive device with improved metallurgical bonding between dissimilar metal layers, the method comprising:
   fixing conducting polymer layers to opposing first and second sides of a device core of a first metal material;
   etching a pattern of recesses into the conducting polymer layers to the device core;
   applying a vapor phase metal bonding material to at least an exposed surface of the device core, a bonding material layer being formed on the device core;
   etching away edges of the bonding material layer;
   forming electrode contacts onto the conducting polymer layers;
   laminating an insulating dielectric around the device core and the conducting polymer layers, one or more vias being at least partly defined by the insulating dielectric corresponding to the pattern of recesses in the conducting polymer layers;
   filling the one or more vias with a second metal material different from the first metal material; and
   forming a first terminal metal layer and a second terminal metal layer onto the insulating dielectric, the first terminal metal layer and the second terminal metal layer being connected with the electrode contacts and the one or more vias.

2. The method of claim 1, further comprising etching a through slot extending through the conducting polymer layers and the device core.

3. The method of claim 2, wherein a through via is defined by the insulating dielectric corresponding to the through slot etched through the conducting polymer layers and the device core.

4. The method of claim 2, wherein the edges of the bonding material layer and the through slot are etched with a laser.

5. The method of claim 1, wherein the electrode contacts are formed of the second metal material.

6. The method of claim 1, further comprising sintering the second metal material filled in the one or more vias.

7. The method of claim 1, further comprising pattern etching the first terminal metal layer and the second terminal metal layer.

8. A method for fabricating an integrated passive device with improved metallurgical bonding between dissimilar metal layers, the method comprising:
- etching a pattern of recesses into a device laminate structure defined by a device core of a first metal material, first and second conducting polymer layers fixed to opposing sides of the device core, and first and second metal layers fixed to respective first and second conducting polymer layers with a carbon coating in between, at least one of the recesses extending from the first and second metal layers to the device core;
- depositing electrode contacts onto the first and second metal layers;
- depositing an insulating dielectric around the device laminate structure with the recesses therein being filled with the insulating dielectric, an encapsulate structure with top and bottom faces being defined by the insulating dielectric;
- drilling one or more vias in areas corresponding to the recesses;
- applying a vapor phase metal bonding material to exposed surfaces of the encapsulate structure and the device core, with a contiguous bonding material layer being formed thereon;
- filling the one or more vias with a second metal material different from the second metal material; and
- laminating a first terminal metal layer and a second terminal metal layer onto the encapsulate structure, the first terminal metal layer and the second terminal metal layer being connected to the one or more vias.

9. The method of claim 8, further comprising:
- removing residual portions of the insulating dielectric in areas corresponding to the electrode contacts with terminal connection recesses being defined; and
- filling the terminal connection recesses with the second metal material,
- wherein the vapor phase metal bonding material is applied to exposed surfaces of the electrode contacts with the residual portions of the insulating dielectric removed, the bonding material layer corresponding thereto being contiguous with the bonding material layer of the encapsulate structure and the device core.

10. The method of claim 8, wherein another one of the recesses extends from an entirety of the encapsulate structure between the top and bottom faces.

11. The method of claim 8, further comprising pattern etching the first terminal metal layer and the second terminal metal layer.

12. The method of claim 8, wherein the first metal material is aluminum and the second metal material is copper.

13. A method for fabricating an integrated passive device with improved metallurgical bonding between dissimilar metal layers, the method comprising:
- forming a device laminate structure including a device core of a first metal material;
- depositing a vapor phase metal bonding material to at least exposed surfaces of the device core, a bonding material layer being formed on the device core;
- filling, with a second metal material, one or more recesses defined in the device laminate structure, a metallurgical bond being established between the first metal material and the second metal material through the bonding material layer.

14. The method of claim 13, wherein forming the device laminate structure includes fixing conducting polymer layers to opposing first and second sides of the device core and etching the one or more recesses.

15. The method of claim 14, further comprising:
- forming electrode contacts onto the conducting polymer layers; and
- laminating an insulating dielectric around the device core and the conducting polymer layers.

16. The method of claim 15, further comprising:
- forming a first terminal metal layer and a second terminal metal layer onto the insulating dielectric.

17. The method of claim 13 wherein forming the device laminate structure includes:
- etching the one or more recesses into the device laminate structure, the device laminate structure additionally including first and second conducting polymer layers fixed to opposing sides of the device code and first and second metal layers fixed to respective first and second conducting polymer layers with a carbon coating in between;
- depositing electrode contacts onto the first and second metal layers;
- depositing an insulating dielectric around the device laminate structure; and
- drilling one or more vias in areas corresponding to the one or more recesses.

18. The method of claim 17, further comprising:
- laminating a first terminal metal layer and a second terminal metal layer onto the device laminate structure.

19. The method of claim 18, further comprising pattern etching the first terminal metal layer and the second terminal metal layer.

20. The method of claim 13, wherein the first metal material is aluminum and the second metal material is copper.

* * * * *